(12) United States Patent
Quandt et al.

(10) Patent No.: US 11,137,457 B2
(45) Date of Patent: Oct. 5, 2021

(54) SENSOR ELEMENT FOR MAGNETIC FIELDS HAVING HIGH FREQUENCY BANDWIDTH

(71) Applicant: Christian-Albrechts-Universitaet zu Kiel, Kiel (DE)

(72) Inventors: Eckhard Quandt, Heikendorf (DE); Anne Kittmann, Kiel (DE); Sebastian Zabel, Kiel (DE); Erdem Yarar, Kiel (DE); Franz Faupel, Heikendorf (DE); Reinhard Knoechel, Elmshorn (DE); Michael Hoeft, Laboe (DE); Phillip Durdaut, Kiel (DE)

(73) Assignee: Christian-lbrechts-Universitaet zu Kiel, Kiel (DE)

( * ) Notice: Subject to any disclaimer, the term of this patent is extended or adjusted under 35 U.S.C. 154(b) by 263 days.

(21) Appl. No.: 16/462,314

(22) PCT Filed: Oct. 6, 2017

(86) PCT No.: PCT/DE2017/100848
§ 371 (c)(1),
(2) Date: May 20, 2019

(87) PCT Pub. No.: WO2018/099506
PCT Pub. Date: Jun. 7, 2018

(65) Prior Publication Data
US 2019/0317161 A1 Oct. 17, 2019

(30) Foreign Application Priority Data
Dec. 1, 2016 (DE) ..................... 10 2016 123 274.2

(51) Int. Cl.
*G01R 33/09* (2006.01)
*G01R 33/18* (2006.01)
(Continued)

(52) U.S. Cl.
CPC ............ *G01R 33/095* (2013.01); *G01L 1/125* (2013.01); *G01N 29/022* (2013.01); *G01R 33/18* (2013.01); *G01N 2291/0423* (2013.01)

(58) Field of Classification Search
None
See application file for complete search history.

(56) References Cited

U.S. PATENT DOCUMENTS 4,456,850 A * 6/1984 Inoue ................. H03H 9/02102
310/324
4,891,587 A 1/1990 Squire
(Continued)

FOREIGN PATENT DOCUMENTS

CN 101504446 A 8/2009
EP 1548702 A1 6/2005
(Continued)

OTHER PUBLICATIONS

International Search Report dated Jan. 5, 2018, in International Application No. PCT/DE2017/100848.
(Continued)

*Primary Examiner* — Jermele M Hollington
(74) *Attorney, Agent, or Firm* — Patent Central LLC; Stephan A. Pendorf

(57) ABSTRACT

A magnetic field sensor element with a piezo electric substrate having predetermined shear wave velocity $V_S$, two pairs of interdigital electrodes, arranged on the substrate on the ends of a delay section, having a period length p of at least 10 micrometers, a non-magnetic, electrically non-conductive guide layer arranged on the substrate along the delay section, and a magnetostrictive functional layer arranged on the guide layer, wherein the shear wave velocity in the guide layer is smaller than $V_S$, wherein a) the substrate is oriented to generate and propagate mechanical shear waves upon applying a temporally periodic, electrical volt-
(Continued)

age to at least one interdigital electrode pair in the range of frequency $V_S/p$ and, wherein b) the thickness of the guide layer equals at least 10% and at most 30% of the period length p of the interdigital electrodes.

7 Claims, 5 Drawing Sheets

(51) Int. Cl.
*G01L 1/12* (2006.01)
*G01N 29/02* (2006.01)

(56) References Cited

U.S. PATENT DOCUMENTS

| | | | | |
|---|---|---|---|---|
| 5,189,914 | A | * | 3/1993 | White .................... G01H 13/00 73/19.03 |
| 5,959,388 | A | * | 9/1999 | Graebner ................ H03H 9/22 310/313 R |
| 8,764,677 | B2 | * | 7/2014 | Toumazou ............... A61B 8/06 600/561 |
| 9,329,154 | B1 | * | 5/2016 | Allendorf ............ G01N 29/024 |
| 2007/0183190 | A1 | * | 8/2007 | Eyckmans .......... G11C 11/1673 365/173 |
| 2007/0285184 | A1 | * | 12/2007 | Eyckmans ............. G01R 33/02 331/107 R |
| 2008/0163694 | A1 | | 7/2008 | Haskell et al. |
| 2009/0206844 | A1 | | 8/2009 | Sabah et al. |
| 2010/0164487 | A1 | * | 7/2010 | Eyckmans ............ G11C 11/161 324/228 |
| 2013/0289913 | A1 | | 10/2013 | Jahns et al. |

FOREIGN PATENT DOCUMENTS

| | | |
|---|---|---|
| EP | 2635913 B1 | 12/2013 |
| JP | 2007304087 A | 11/2007 |

OTHER PUBLICATIONS

Meriem Elhosni et al.: "Magnetic field SAW sensors based on magnetostrictive-piezoelectric layered structures: FEM modeling and experimental validation", Sensors and Actuators A: Physical, vol. 240, Apr. 1, 2016, (Apr. 1, 2016, pp. 41-49, XP055436545, NL ISSN: 0924-4247, DOI:10.1016/j.sna.2015.10.031, cited in the application, the whole document.

* cited by examiner

SENSOR ELEMENT FOR MAGNETIC FIELDS HAVING HIGH FREQUENCY BANDWIDTH

BACKGROUND OF THE INVENTION

Field of the Invention

The invention relates to a magnetic field sensor element, in which acoustic waves are excited in the sensor material by means of electrical excitation, whose propagation velocity is dependent on the influence of an external magnetic field. In particular, the invention relates to a sensor element in which Surface Acoustic Waves (SAW) are generated.

Description of the Related Art

Biomagnetic fields are generated by bioelectric current systems that exist in the neural networks of living organisms. They can be detected to revert to the current systems by way of reconstruction, for example, to determine human local brain activity. A long-term goal is the development of interfaces that can translate the imaginary will of a person into machine instructions without going through the linguistic formulation. Near lying first applications are in the fields of medicine, for example, for the production of functional prostheses, and military, for example, for weapons control.

The biomagnetic flux density is basically very weak and must be detected with a resolution on the Pikotesla scale. Moreover, their essential frequency components are in the interval from below 1 to above about 100 Hz.

The state of the art SQUID sensors can detect these areas, but such sensors are dependent on extreme cooling due to their necessary superconducting components and thus neither cost effective nor user-friendly.

Sensors based on magneto-electric (ME) composite materials, also called ME sensors, have the potential for mass-producible manufacturability and can detect very weak magnetic fields. However, ME sensors are mechanical oscillators that need to be excited in their resonance in order to achieve this high sensitivity. ME sensors in MEMS equipment have resonance frequencies in the high kilohertz range and can only be used with additional measures for frequency conversion, see e.g. EP 2 635 913 B1, to be brought to high sensitivity in the biomagnetic frequency range.

In contrast, Surface Acoustic Wave (SAW) sensors are known which can also detect static or slowly changing magnetic fields by coupling acoustic waves into a magnetostrictive material and observing the propagation velocity of the waves in this material. Utilized here is the change in the modulus of elasticity of a magnetostrictive material in the presence of a magnetic field, referred to for short as the $\Delta E$ effect. The change in the velocity of sound caused by the magnetic field can be determined, for example, by measuring the phase shift of the acoustic wave which propagates from a transmitting to a receiving ultrasonic transducer through a predetermined delay section. Further details are described in Bodong Li, Hommood Al Rowais and Jürgen Kosel (2013). Surface Acoustic Wave Based Magnetic Sensors, Modeling and Measurement Methods for Acoustic Waves and Acoustic Microdevices, Prof. Marco G. Beghi (Ed.), InTech, DOI: 10.5772/55220. (Available from: http://www.intechopen.com/books/modeling-and-measurement-methods-for-acoustic-waves-and-for-acoustic-microdevices/surface-acoustic-wave-based-magnetic-sensors).

From the paper by Elhosni et al, "Magnetic field sensors based on SAW-magnetostrictive piezoelectriclayered structures: FEM modeling and experimental validation", Sensors and Actuators A 240 (2016) 41-49, a SAW magnetic field sensor element formed of multiple layers is known. The sensor element is constructed as a resonator, which experiences a detuning of the resonant frequency as a function of the magnetic flux density in the presence of a static magnetic field. The vibrations are excited with radio waves of several 100 MHz, and the relative detuning $\Delta f/f$ is determined in units of ppm (parts per million). As sensitivity of their sensor, Elhosni et al. indicate values of about 1 ppm/mT.

Magnetic inductions of the order of magnitude of micro- or even nanotesla are not accessible with the currently available thin-film based SAW sensors. This is mainly due to the small amount of magnetic material, which should influence the sound propagation due to an external magnetic field.

U.S. Pat. No. 4,891,587 to Squire discloses a magnetic field sensor which can detect flux densities up to the order Pikotesla according to the same principle of the change in the speed of sound due to the $\Delta E$ effect. It consists of a strip of metallic glass to which piezotransducers are bonded. The strip is cantilevered with a predetermined thickness between 25 and 1,000 microns, and the excitation frequencies are in the corresponding interval 0.1 to about 100 MHz. The quotient of sound velocity (2,600 m/s) and excitation frequency should always be set greater than the strip thickness, so that preferably shear waves propagate in the strip. The width of the strip is 20 millimeters, and the transducers are 200 millimeters apart, which is the length of the delay section. The volume of magnetic material traversed by the sound waves is about one million times greater in Squire's construction than that of Elhosni et al., which explains the significantly increased sensitivity.

However, due to its dimensions, a Squire sensor element can not readily be excited by the radiation of radio waves, as one would expect from SAW sensors as passive elements for remote interrogation. Furthermore, the size of the sensor prevents measurements with a high spatial resolution, such as those for magnetocardiography (MKG) or magnetoencephalography (MEG), necessary for solving the inverse problem—localization of the current that has triggered the measured magnetic field distribution.

From Zhou et al., "Theoretical and Experimental Study of Multilayer Piezo-magnetic Structure-Based Surface Acoustic Wave Devices for High Sensitivity Magnetic Sensor", published in: Ultrasonics Symposium (IUS), 2013 IEEE International, p. 212-215, a SAW magnetic field sensor is used to excite a 200 nm thick layer of $TbCO_2/FeCo$ on lithium niobate ($LiNbO_3$) into Rayleigh and shear waves, whose velocity changes due to an applied magnetic field, are investigated. In this work, the change in the elastic properties of the magnetostrictive thin film is estimated to be about 20%. This magnitude of the $\Delta E$ effect is confirmed in various thin film systems by the work of Ludwig and Quandt, published in: Ludwig, A.; Quandt, E.: Optimization of the $\Delta E$-effect in Thin Films and Multilayers by Magnetic Field Annealing, IEEE Trans. Magn. 38 (2002), 2829-2831.

BRIEF SUMMARY OF THE INVENTION

The object of the invention is to propose a magnetic field sensor in the manner of a SAW sensor, which has an improved magnetic field sensitivity compared to the prior art.

The object is achieved by a magnetic field sensor element comprising a piezoelectric substrate having a predetermined shear wave velocity $V_s$, two pairs of interdigital electrodes, arranged on the substrate on the ends of a delay section, having a period length p of at least 10 micrometers, a non-magnetic, electrically non-conductive guide layer arranged on the substrate along the delay section, and a magnetostrictive function layer arranged on the guide layer, wherein the shear wave velocity in the guide layer is smaller than $V_s$, wherein a) the substrate is oriented to generate and propagate mechanical shear waves upon applying a temporally periodic, electrical voltage to at least one interdigital electrode pair in the range of frequency $V_s/p$ and, wherein b) the thickness of the guide layer is at least 10% and at most 30% of the period length p of the interdigital electrodes.

The dependent claims indicate advantageous embodiments, for example directed to a magnetic field sensor element, which is designed as a resonator.

The starting point of the invention is the work of Elhosni et al., in which a sensor element with the following components is presented:

The substrate material is lithium niobate (LiNbO3) (sound velocity 4112 m/s). Arranged on the substrate are interdigital electrodes (IDE) of aluminum formed with a period length of 24 microns. On the substrate and covering the IDE, a zinc oxide (ZnO) layer (the sound velocity at 2,747 m/s is lower than the lithium niobate layer) with a thickness of 250 nanometers is applied to electrically isolate the IDE from the metallic functional layer. The magnetostrictive functional layer arranged on the ZnO layer consists of elemental nickel and is 200 nanometers thick.

The sensor of Elhosni et al. is designed as a resonator and thus has no delay section. However, the aforementioned components can be readily used in a sensor with delay section.

Elhosni et al. investigate their structure experimentally and theoretically using finite element methods. They are based on the excitement of Rayleigh acoustic modes in their layered system, which also bring about a material movement perpendicular to the layer planes. The largest amplitudes are expected near the surface, i.e. in the functional layer. Nevertheless, the acoustic wave does not predominantly move through the magnetostrictive material, so it can not feel any influence from an external magnetic field in this part.

Elhosni et al. see improvement potential for the sensitivity of their sensor in focusing the energy of the acoustic wave more in the functional layer. As measures, they propose, inter alia, to form the electrically insulating layer between the substrate and functional layer of a material with a higher speed of sound. The layer thicknesses, on the other hand, are considered already optimized.

The present invention now points in the opposite direction.

With regard to the sensor of Squire, whose sensitivity for magnetic field frequencies below 1 kHz is reported to be particularly high, it seems attractive, especially for the measurement of biomagnetic fields, to rely on the excitation and propagation of shear waves through the functional layer, which cause material movements only in the layer plane.

Such waves, also referred to as Love modes, can be stimulated in a targeted manner by selecting, according to the invention, suitable cut surfaces of the piezoelectric substrates on which the IDEs are arranged. For example, for lithium niobate or lithium tantalate, these are the 36°YX cuts, and for quartz the so-called AT and ST cuts can be used.

Concentrating the acoustic wave in the functional layer is accomplished by providing a guiding layer on the substrate having a lower velocity of sound than the substrate. It is considered to be very advantageous, moreover, that the density of the material of the guide layer is smaller than the density of the substrate material and the guide layer has low acoustic losses.

According to the invention, the thickness of the guide layer should be at least 10% and at most 30% of the acoustic wavelength. The acoustic wavelength is determined by the period length of the IDE and agrees with this.

In principle, in addition to the fundamental mode, higher harmonic modes are also excited, and in particular the excitation of higher harmonics can take place deliberately by the choice of the electrical excitation frequency and can also be used for readout. However, the choice of the thickness of the guide layer essentially determines which wavelengths can propagate with which attenuation in the guide layer.

If one wants to generate Love modes, then the thickness of the guide layer must be significantly smaller than the propagating wavelength, which in the case according to the invention for the higher-odd-numbered-harmonic modes is generally not well met, because the thickness of the guide layer according to the invention is oriented at the fundamental mode whose detection is primarily intended. The wavelength of the fundamental mode is here predetermined by the period length of the IDE at at least 10 micrometers, and the guide layer according to the invention is at least 1 micrometer thick.

It should be emphasized that the zinc oxide layer on the sensor according to Elhosni et al. is intended primarily as an insulating layer and only secondarily as a means for concentrating the wave in the functional layer. For the concentration of Love modes according to the present invention, with the used wavelength of 24 microns in Elhosni et al., it is in any case at least an order of magnitude too thin.

BRIEF DESCRIPTION OF THE SEVERAL VIEWS OF THE DRAWINGS

The invention will be explained in more detail below, also with reference to figures and an embodiment. There is show in.

DETAILED DESCRIPTION OF THE INVENTION

Figure 1:
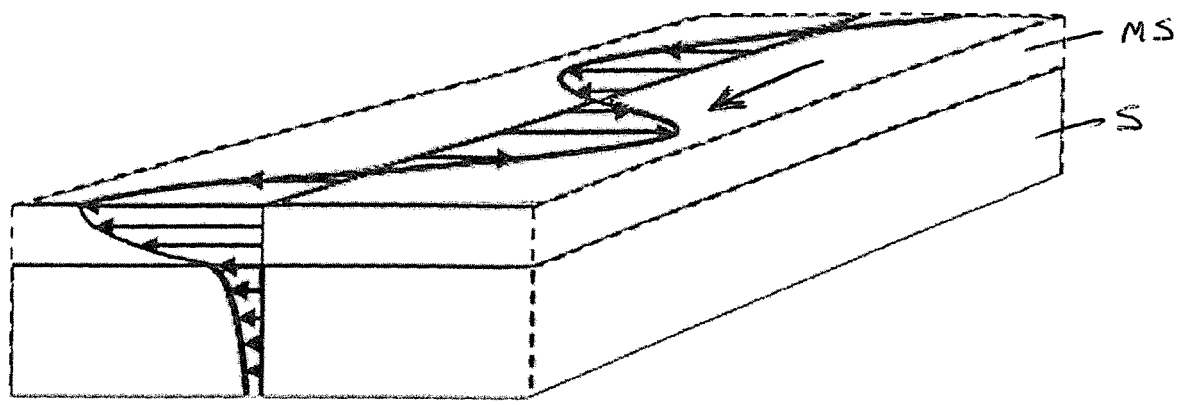
FIG. 1 a sketch of a Love mode.

FIG. 1 shows a typical amplitude curve of a Love mode in a layered system. The amplitudes indicate the extent of material shifts in the layers of different depths. Love modes are created by interference of acoustic P- and S-body sound waves in bodies with stratified varying speeds of sound. The energy of the Love mode is localized near the surface as the speed of sound decreases towards the surface.

Figure 2:
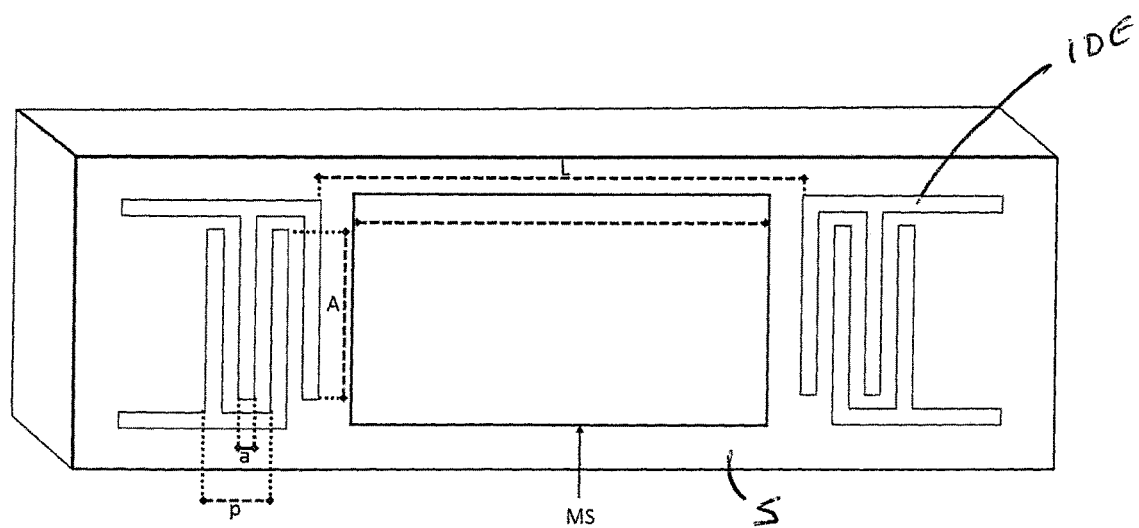
FIG. 2 a sketch of a magnetic field sensor element with delay section.

FIG. 2 shows a magnetic field sensor element with a delay section according to the teachings of the invention. The substrate consists of a piezoelectric with a suitably oriented surface, so that upon application of an electric field directed along the substrate plane, preferably only forces in the substrate plane are exerted. As already mentioned, AT and ST cuts of quartz or even 36°YX cuts of lithium niobate or lithium tantalate are suitable for this purpose. However, the prior art knows many other alternatives; the invention is not limited to the examples mentioned. Furthermore, FIG. 2 shows a delay section of length L, at each of whose two ends a pair of interdigitated interdigital electrodes is arranged on the substrate. An IDE can be formed of any electrical conductor material, for example of a metal, which adheres well to the substrate even under vibration conditions. Preferably, the IDEs are formed of aluminum or gold.

Figure 3:
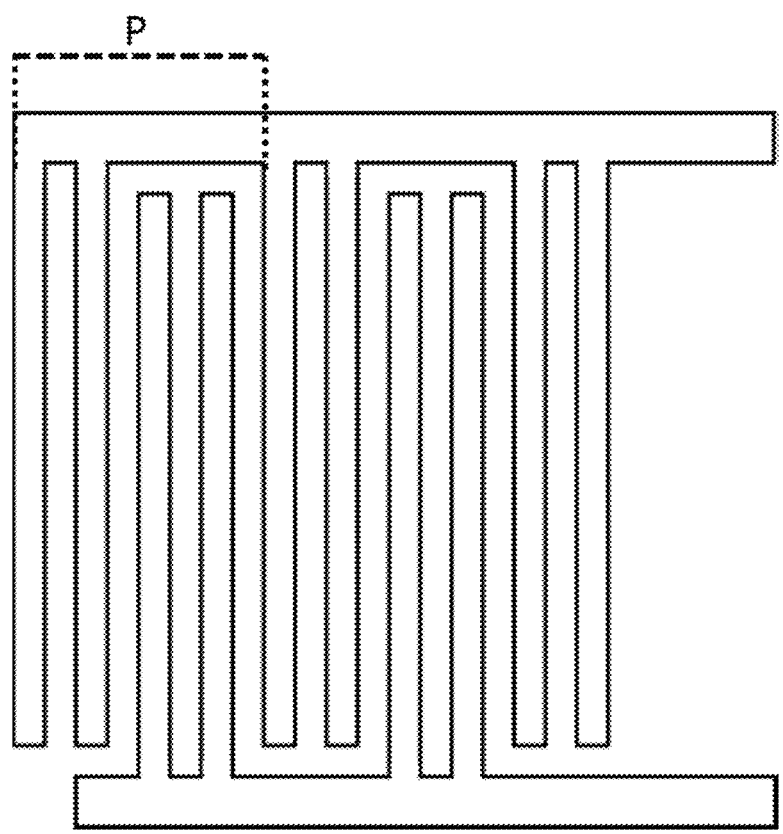
FIG. 3 a sketch of a double-finger IDE.

Each individual IDE has a plurality of fingers whose arrangement repeats at a regular interval. This interval is commonly referred to as the period length p of the IDE. In the case of SAW sensors, differently configured IDEs are used, for example a double-finger IDE pair sketched in FIG. 3. The period length p is also shown there for clarity.

The smallest distance between two fingers of an IDE pair is indicated in FIG. 2 by a. It determines the distance over which the voltage applied to the IDE drops, and thus the electric field strength acting on the piezosubstrate. The width of the IDE fingers is also set to a in FIG. 2. The overlapping length of the interdigitated IDE fingers of a pair is referred to as the aperture A and describes the width of the excitation region in which the SAW is generated.

In the arrangement of FIG. 2, it is provided to apply to one of the two IDE pairs a periodic, electrical voltage signal and thereby trigger periodic contraction and expansion movements in the substrate. Usually, the excitation voltage has a temporally harmonic curve and a single predetermined frequency, e.g. $U(t)=U0*\sin(2\pi f*t)$. One achieves the greatest energy input into the substrate at resonant excitation, thus at that frequency $f_R$, for which the $V_S=p*f_R$ holds.

Here, $V_S$ means the shear wave velocity in the substrate, which refers to the predominantly excited vibration modes. It can be determined experimentally by a frequency search.

A portion of the energized IDE pair generated acoustic wave reaches the other IDE pair and is detected there as an output voltage signal.

In FIG. 2, a rectangular strip of material MS approximately the length L and width A is shown, which is arranged along the delay section between the IDE pairs. The strip could also extend beyond the IDE. Its purpose is to capture much of the energy of the generated acoustic wave and guide the wave from the exciting to the detecting IDE pair. The wave is channeled, and the array of two IDE pairs and one of the two "connecting" strips of material is also referred to as the SAW channel.

The invention relates essentially to the selection of a favorably oriented substrate surface and the structure of the strip of material, which is composed of two layers.

The first layer MS consists of a non-magnetic, electrically non-conductive material whose shear wave velocity is less than the shear wave velocity $V_S$ in the substrate S. In this case, according to the invention, their thickness should be between 10% and 30% of the period length p of the IDE. In this case, it is capable of absorbing the vibrational energy from the substrate and concentrating in it; Love modes are formed as in FIG. 1. This first layer is referred to here as a guide layer. It can be formed, for example, from the materials silicon dioxide, zinc oxide, polydimethylsiloxane, polymethyl methacrylate (PMMA) and polyimide and in this case also be configured in particular as a multilayer coating system of a combination of these materials. Other materials are possible and known. The selection depends on the substrate used.

The second layer is disposed on the first and consists of a magnetostrictive material. Here, both metallic and non-conductive materials come into consideration, which have a high $\Delta E$ effect of the shear modulus, i.e. change in the shear modulus per magnetic field. The extent of magnetostriction is not important, and a material exhibiting large changes in length in the variable magnetic field may be considered preferable because the effect of the magnetic field on wave propagation in such materials should typically be greater. However, priority is given to the extent of the $\Delta E$ effect for the shear modulus, because the elastic properties determine the propagation velocity of acoustic waves. The more they change under the influence of an external field, the greater the sensitivity of the sensor element. Examples of a suitable material are the metallic glass FeCoSiB, amorphous FeGaB or multilayers of TbFe and FeCo.

As regards the choice of the thickness of the magnetostrictive functional layer, compromise solutions are to be sought. The following arguments should be considered:

It should first be noted that the layer thickness can be very small, for example only a few 100 nanometers. This is advantageous with regard to the production outlay, for example if it is to be constructed in the form of a layer system which sets up the magnetic anisotropy via the exchange bias interaction according to the teaching of document EP 2 538 235 B1. The use of a layer system formed of layers of an antiferromagnetic material deposited on one another and of a ferromagnetic material in an alternating arrangement as a magnetostrictive functional layer is considered to be a preferred embodiment.

On the other hand, the general rule is that magnetic fields require a volume of material that is not too small to produce a measurable effect. Not least because of this, the sensor from Squire is much more sensitive than the previous, much smaller SAW sensors. Thicker films also generate more stray field than thinner ones, which can be detrimental to sensitivity.

The influence of a magnetic field on the magnetostrictive functional layer is scanned here via a kind of Love wave sensor. Typically, such sensors are used as highly sensitive scales, i.e. in a certain range of thicknesses, starting from zero, one can start from a—in a first approximation proportional—signal increase with increasing layer thickness. For large layer thicknesses, however, a saturation effect is expected here.

According to current estimates by the inventors for the magnetostrictive layer, thicknesses between about 100 nanometers and a few micrometers, for example 10 μm or even 20 μm should be considered.

In FIG. 2, the material strip comprising the guiding layer and the magnetostrictive layer is designated with the abbreviation MS. This emphasizes that the focus here is on the measurement of magnetic fields. As stated above, SAW sensors are known which have a guiding layer in the manner described herein to form Love modes on the surface. These modes are severely disturbed when additional masses are deposited on the surfaces. The known applications of Love wave sensors are in the weighing of very small masses and the measurement of viscosities. They are usually used in contact with a fluid, and it is one of the benefits of the Love modes that in use they give little sound energy to the fluid.

The sensor element described here with a magnetostrictive functional layer on a guide layer is to the knowledge of the inventors the first attempt to determine magnetic fields with Love modes in a SAW sensor.

The production of a magnetic field sensor element according to the invention in the laboratory will be described below as an exemplary embodiment.

The piezoelectric substrate with an orientation that allows the formation of mechanical shear waves is present as a wafer of 4 inches=10.16 cm in diameter. These are ST quartz, i.e. a Y-cut with a thickness of 500 µm tilted by 42° 45'+/−6' about the Z axis. If necessary, a cleaning is carried out in an ultrasonic bath with acetone and subsequent rinsing with isopropanol and deionized water before coating. The shear wave velocity of quartz is about 5,050 m/s, according to the literature.

First, a 12 nm thick chromium layer as adhesion promoter and then a 300 nm thick gold layer for the interdigital electrodes are deposited on the clean substrate by means of magnetron sputtering. Another 12 nm thick chromium layer serves as a protective layer for the contacts.

After that, the structures for the IDEs are transferred to a positive photoresist by means of lithography, which is used as an etching mask in the next step. Thereby, the alignment of the quartz wafer with the mask must be taken into account. For the selected quartz wafers, the wave propagation direction is parallel to the flat side of the wafer. The chromium-gold layer is removed from the unmasked areas by ion beam etching to transfer the IDE structures to the chromium-gold layer. In this example, IDEs are described as double-finger structures, cf. FIG. 3, generated with a period length p=28 microns. The finger width is a=3.5 microns, the aperture is A=1,680 microns and the distance of the IDE pairs on the wafer is L=3,840 microns, cf. FIG. 2.

After the etching, the photoresist is removed in an ultrasonic bath with NMP (N-methyl-2-pyrrolidone) at 70° C. This is followed by another cleaning in an ultrasonic bath with acetone and isopropanol, each at 45° C. The wafer is finally rinsed once again with fresh isopropanol and with deionized water and dried in a spin dryer.

The deposition of the guide layer takes place by means of plasma-assisted chemical vapor deposition. A 4.5 µm thick amorphous silicon oxide layer is deposited over the entire wafer. The shear wave velocity of the guide layer is then about 2,850 m/s. Subsequently, this is masked again with a lithography process and the guide layer is patterned with reactive ion etching. In order to completely remove any residues after the reactive ion etching, a further etching step, for example wet-chemical with buffered hydrofluoric acid, can be carried out. Remains of the electrically insulating silicon oxide layer are thereby rapidly removed and electrical contact to the IDEs can be made.

After structuring, the leader layer covers the entire delay section and both IDE structures. The etching exposes the contacts of the IDEs with which the signal is generated and read out. In addition, an angled end edge is structured on the side of the IDEs facing away from the delay section. This ensures that the generated wave, which propagates in both directions of the IDE structures, is not reflected at the straight edge of the guide layer and so may cause interference in the delay section between the reflected and the unreflected wave. The structuring is then again followed by stripping as already explained above.

The magnetostrictive functional layer, in this case 200 nanometers FeCoSiB, is deposited on the guide layer. This can be structured either via a lift-off process or via ion beam etching. For the lift-off process, a photoresist mask is first produced by means of lithography, and then the magnetic layer is deposited by means of magnetron sputtering.

The sensor element produced as described above is examined and evaluated below with respect to its sensitivity to an external magnetic field.

Before this, some preferred developments of the sensor element will be presented.

For the measurement of magnetic field gradients, it is preferable to arrange a third pair of interdigital electrodes in the middle of a delay section for every two pairs of interdigital electrodes at the ends of the delay section. This middle IDE pair is provided for applying the excitation voltage, while the two outer IDE pairs act as detectors of the acoustic waves. Thereby practically two different delay sections lie in close proximity to each other along the direction of the delay section, which can detect also local differences in the external magnetic field—and consequently a gradient. Incidentally, the layer structure is the same as described above, that is, Love modes are also formed here.

Alternatively or additionally, for magnetic field gradient measurements, it is an advantageous embodiment of a sensor element if it has a plurality of SAW channels next to one another such that all delay sections are aligned parallel to one another. In this way, changes in the magnetic field perpendicular to the direction of the delay section can be detected simultaneously.

Particularly preferably, one can combine the two aforementioned approaches without any problems and thus create relatively inexpensive magnetic field sensor elements with a magnetic field gradient sensitivity along two axes.

Figure 4:
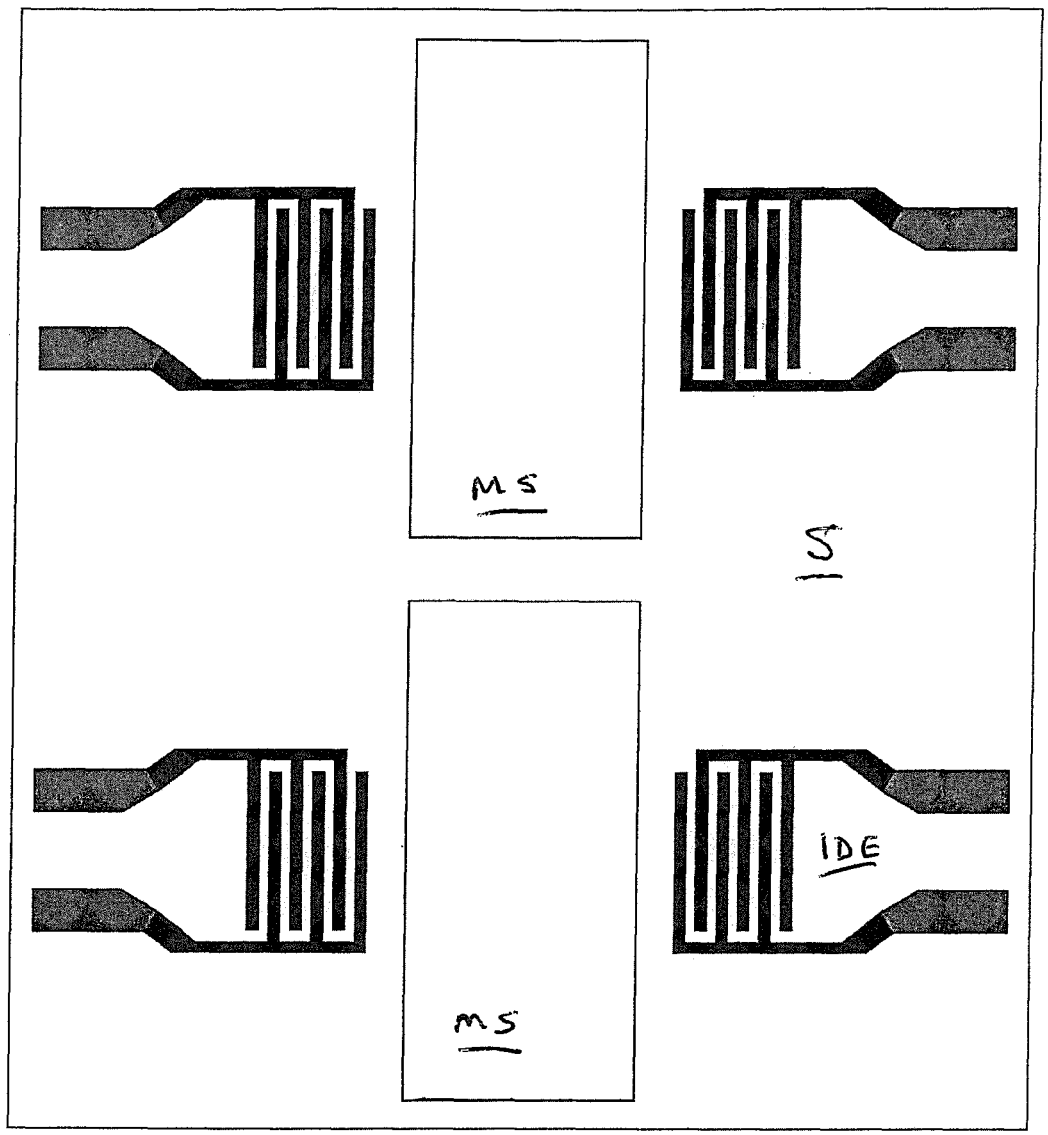
FIG. 4 a sketch of a magnetic field sensor element comprising a functional layer and a reference layer.

A further advantageous embodiment is to equip the magnetic field sensor element as a magnetic field sensor double element with an intrinsic compensation for temperature influences. For this purpose it is proposed, as sketched in FIG. 4, to provide the sensor element with two separate, parallel and approximately equal SAW channels, the first channel having a magnetostrictive functional layer and the second channel a non-magnetostrictive layer wherein both channels include the same guide layer. With the same lateral dimensions and layer thicknesses, the different layers of the two channels should—if possible—have the same acoustic properties. Due to the lack of a magnetostrictive functional layer, the second channel shows no dependence on magnetic fields and can be used as a temperature reference.

In other words, a temperature-compensated magnetic field sensor double element is proposed which comprises a prescribed magnetic field sensor element and additionally a reference sensor element arranged adjacently to the magnetic field sensor element. The reference sensor element is identical in terms of substrate, interdigital electrodes and guide layer with the magnetic field sensor element, and has its own delay section parallel to the delay section of the magnetic field sensor element, along which a functional layer of the reference sensor element is arranged. In this case, the functional layer of the reference sensor element should have the same acoustic properties as the functional layer of the magnetic field sensor element and be formed from a non-magnetostrictive material. The temperature-compensated magnetic field sensor double element thus always has two channels.

The actual measurement then takes place as difference measurement between the two channels. Under the general assumption that both channels have the same change in temperature, corresponding temperature-related phase changes in both channels would occur in a similar manner, so that they would be compensated by the differential measurement. Likewise, all other signals would be compensated for except for the phase change caused by the magnetic field. As the signal of the sensor element only the contribution of the magnetic field remains, regardless of the ambient temperature.

If the same source is used to control the two sensors, both also have the same phase noise that would also be compensated by the difference measurement.

A further embodiment of the sensor element may be to form the element as a SAW resonator.

The structure of the magnetic field sensor as a SAW resonator is characterized by an electrode structure and a volume of material layers connected thereto in which energy is stored. At its resonant frequency, a SAW resonator exhibits a large change in the phase angle of the reflection or transmission signal and is extremely narrowband in the frequency bandwidth.

Figure 5:
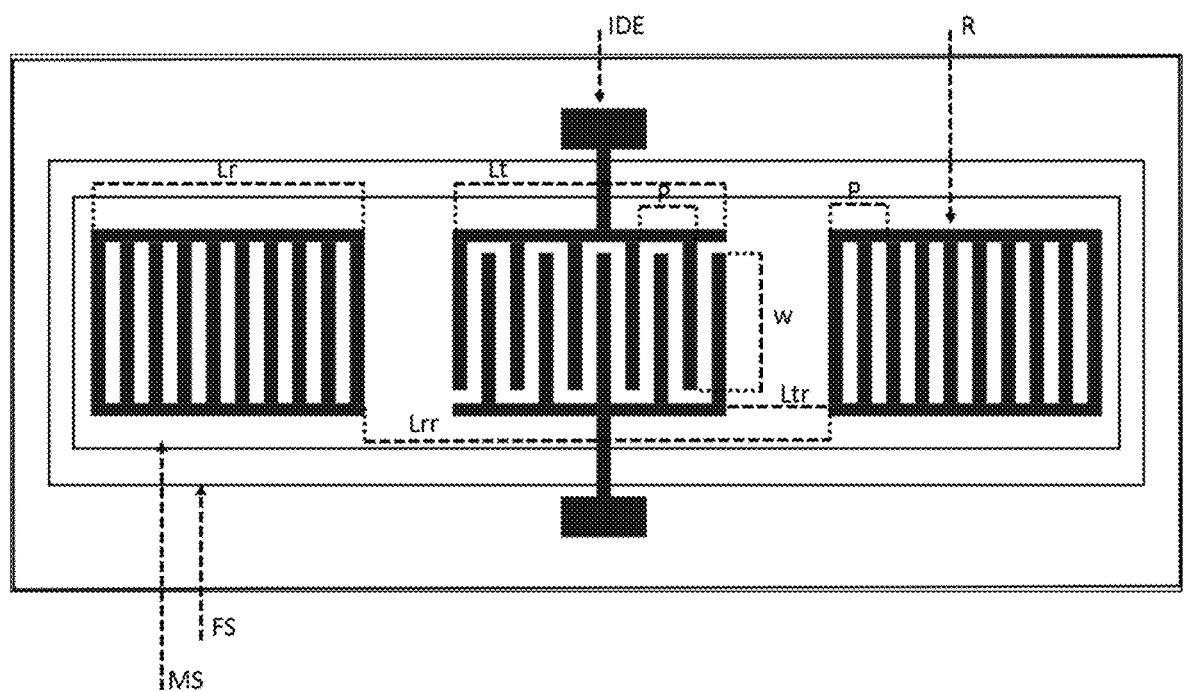
FIG. 5 a sketch of a magnetic field sensor element as a resonator.

SAW resonators can be distinguished between reflection and transmission resonators. One possible form of a reflection resonator is shown in plan view in FIG. 5. The electrode pair designated IDE has the period length p, the length Lt and the aperture w and serves as input and output. If the opposing second connection is earthed, signals at the electrodes IDE can be fed in or collected against earth. The acoustic wave is excited by the IDE structure in the guiding layer FS and spreads to the left and right. It is reflected back at the reflectors R of length Lr, forming a standing wave in the running space of length Lrr. The length of the track and thus the resonance frequency change as soon as a magnetic field acts on the functional layer MS of the sensor. The associated phase shift is measured. The reflectors R consist, for example, of metal lands electrically short-circuited on the longitudinal sides, or idling, here spaced with the half period length p. In a transmission resonator, the central IDE structure is duplicated, so that input and output can be decoupled from each other.

The structure of the sensor as a delay circuit can also be realized in transmission, integrated into a ring circuit and also used as a resonant element in an oscillator circuit. For the guiding layer and the magnetostrictive layer in a SAW resonator, the same conditions apply as for the construction as a delay circuit.

Thus, the invention task can be solved according to the same inventive concept with a magnetic field sensor element comprising a piezoelectric substrate having a predetermined shear wave speed $V_S$, at least one pair of interdigital electrodes arranged on a substrate in a running space having a period length p of at least 10 micrometers, at least two reflectors arranged at the ends of the running space for acoustic shear waves of wavelength p, a non-magnetic, electrically non-conductive guide layer arranged on the substrate along the running space, and a magnetostrictive functional layer arranged on the guide layer, wherein the shear wave velocity in the guide layer is less than $V_S$, characterized in that the substrate is oriented for the generation and propagation of mechanical shear waves upon driving of at least one interdigital electrode pair with a time-periodic, electrical voltage in the range of frequency $V_S/p$ and the thickness of the guide layer is at least 10% and at most 30% of the period length p of the interdigital electrodes.

All the aforementioned embodiments of the magnetic field sensor according to the invention can also be arranged in a larger number on the same substrate, because they can be produced by the known methods of thin-film technology. As already mentioned, the adjacent arrangement of several sensors is already advantageous because such an arrangement also allows the measurement of magnetic field gradients.

As a preferred embodiment, a magnetic field gradient sensor element is proposed, which has at least two structurally magnetic field sensor elements—according to any of the abovementioned embodiments—with parallel aligned delay sections or running spaces of the magnetic field sensor elements perpendicular to a common central axis. The central axis then corresponds to the axis along which a magnetic gradient can be determined.

For the final evaluation of the sensitivity of a magnetic field sensor element according to the teachings of this invention, very precise phase measurements are made on the sensor element of the exemplary embodiment, from which the shear wave velocity is calculated as a function of the externally applied magnetic field. The result is shown graphically in FIG. 6.

Figure 6:
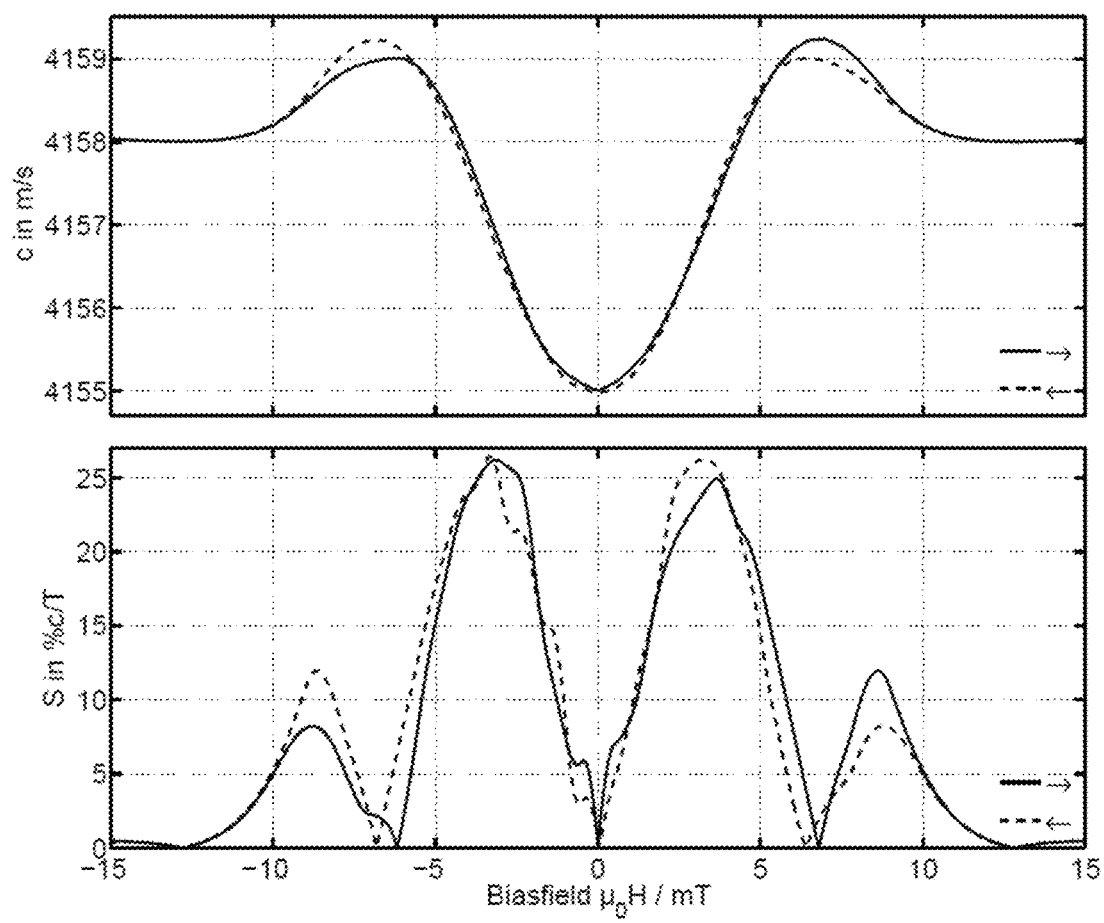
FIG. 6 a plot of first measurement results with a prototype.

The upper graph of FIG. 6 indicates the absolute shear wave velocity in the guide layer and magnetostrictive functional layer system resulting from the measurement signals of the IDE arrangement. The respective magnetic flux density is plotted on the abscissa. Hysteresis in the magnetic functional layer causes two curves to occur, depending on whether one passes through the magnetic field from the positive to the negative direction or vice versa. The lower graph of FIG. 6 shows the derivatives of the upper curves, which are to be understood as sensitivity of the sensor. The maximum sensitivity is exhibited by the sensor at a bias field of about 3 mT where it is about 25% of the shear wave speed per Tesla. This value can be compared very well with the work of Zhou et al., from which 0.25% of the shear wave speed per 100 oersteds can be read for a SAW sensor without any guiding layer.

In Zhou et al. however, a ΔE effect of the order of 20% is assumed, while the sensor element of the illustrative embodiment has not yet been optimized in this respect; there is thus still a clear potential for improvement that can be exploited. However, even the prototype is of similar good quality as the sensor from Zhou et al. with its optimized material properties.

In the publication "Sensitivity analysis for Love mode acoustic gravimetric sensors" by Z. Wang, JDN Cheeke, and C K Jen, Applied Physics Letters 64, 2940 (1994); doi: 10.1063/1.111976 it is literally stated: "This result means that the maximum sensitivity of a Love mode sensor, made by a PMMA film overlaid on ST cut quartz, can be about 20 times larger than that of a STW sensor on the same substrate and operating at a similar frequency." Although it should be noted that the PMMA has high losses in these dimensions, this calculation shows the great potential of Love wave sensors as a highly sensitive scales. These assessment is also confirmed by "Design and properties of quartz-based Love wave acoustic sensors incorporating silicon dioxide and PMMA guiding layers" by Geoffrey L Harding and Jia Du, Smart Mater. Struct. 6 (1997) 716-720. In Table 1 there, the authors show that for a frequency of about 120 MHz, the mass sensitivity of SH-SAWs can be increased from 14 $cm^2/g$ to 519 $cm^2/g$ for a Love wave sensor optimized with respect to the guide layer.

This increase in sensitivity can also be used directly for magnetic field sensors, since it is due to a corresponding concentration of the acoustic waves on the region of the layer to be measured. Using the same thickness magnetostrictive functional layers with the same ΔE effect for the shear modulus, an optimal guiding layer thus leads to at least an order of magnitude higher sensitivity compared to shear wave SAWs without a guiding layer.

The provision according to the invention of a sufficiently thick guide layer in a suitable relationship to the excited Love mode wavelength appears as a general key concept for the utilization of SAW sensors for the detection of small magnetic fields over a large frequency range from a few hertz to the high kilohertz range. This allows both the detection of current systems with high intrinsic frequency bandwidth and in particular the detection of biomagnetic fields.

The invention claimed is:

1. A magnetic field sensor element comprising a piezoelectric substrate having a predetermined shear wave velocity $V_S$, two pairs of interdigital electrodes, arranged on the substrate on the ends of a delay section, having a period length p of at least 10 micrometers, and a non-magnetic, electrically non-conductive guide layer arranged on the substrate along the delay section and a magnetostrictive functional layer arranged on the guide layer, wherein the shear wave velocity in the guide layer is smaller than $V_S$, and wherein
   a) the substrate is oriented to generate and propagate mechanical shear waves upon applying a temporally periodic, electrical voltage to at least one interdigital electrode pair in the range of frequency $V_s/p$,
   b) the thickness of the guide layer is at least 10% and at most 30% of the period length p of the interdigital electrodes,
   c) the density of the material of the guide layer is lower than the density of the substrate material, and
   d) for each two pairs of interdigital electrodes arranged at the ends of the delay section, a third pair of interdigital electrodes is provided in the middle of the delay section.

2. The magnetic field sensor according to claim 1, wherein the substrate is formed of a material from the group comprising quartz, lithium niobate and lithium tantalate and the interdigital electrodes are arranged on predetermined cut surfaces.

3. The magnetic field sensor element according to claim 1, wherein the magnetostrictive functional layer has a layer thickness between 100 nanometers and 10 microns.

4. The magnetic field sensor element according to claim 1, wherein the magnetostrictive functional layer is formed as a layer system that comprises successive layers deposited of an antiferromagnetic material and a ferromagnetic material in an alternating arrangement.

5. A magnetic field gradient sensor element, comprising at least two identical magnetic field sensor elements according to claim 1, further comprising parallel aligned delay sections or running spaces of the magnetic field sensor elements perpendicular to a common center axis.

6. A magnetic field sensor element comprising a piezoelectric substrate having a predetermined shear wave velocity $V_S$, two pairs of interdigital electrodes, arranged on the substrate on the ends of a delay section, having a period length p of at least 10 micrometers, and a non-magnetic, electrically non-conductive guide layer arranged on the substrate along the delay section and a magnetostrictive functional layer arranged on the guide layer, wherein
   the shear wave velocity in the guide layer is smaller than $V_S$,
   the substrate is oriented to generate and propagate mechanical shear waves upon applying a temporally periodic, electrical voltage to at least one interdigital electrode pair in the range of frequency $V_s/p$, and
   the guide layer is formed of at least one material from the group comprising silicon dioxide, zinc oxide, polydimethylsiloxane, polymethylmethacrylate (PMMA) and polyimide.

7. The magnetic field sensor double element comprising
   a magnetic field sensor element comprising a piezoelectric substrate having a predetermined shear wave velocity $V_S$, two pairs of interdigital electrodes, arranged on the substrate on the ends of a delay section, having a period length p of at least 10 micrometers, and a non-magnetic, electrically non-conductive guide layer arranged on the substrate along the delay section and a magnetostrictive functional layer arranged on the guide layer, wherein the shear wave velocity in the guide layer is smaller than $V_S$, and the substrate is oriented to generate and propagate mechanical shear waves upon applying a temporally periodic, electrical voltage to at least one interdigital electrode pair in the range of frequency $V_s/p$,
   a reference sensor element adjacent to the magnetic field sensor element which is identical in terms of substrate, interdigital electrodes and guide layer with the magnetic field sensor element and
   a delay section parallel to the delay section of the magnetic field sensor element,
   wherein the functional layer of the reference sensor element has the same acoustic properties as the functional layer of the magnetic field and is formed from a non-magnetostrictive material.

* * * * *